United States Patent

Depauw et al.

[11] Patent Number: 6,090,481
[45] Date of Patent: Jul. 18, 2000

[54] COATED SUBSTRATE FOR TRANSPARENT ASSEMBLY WITH HIGH SELECTIVITY

[75] Inventors: Jean-Michel Depauw, Brussels; Yvan Novis, Grand-Leez, both of Belgium

[73] Assignee: Glaverbel, Brussels, Belgium

[21] Appl. No.: 08/824,841

[22] Filed: Mar. 26, 1997

[30] Foreign Application Priority Data

Mar. 26, 1996 [GB] United Kingdom ............ 9606281

[51] Int. Cl.⁷ ........................................ B32B 5/16
[52] U.S. Cl. .................. 428/336; 428/212; 428/469; 428/433
[58] Field of Search ................. 428/212, 336, 428/469, 216, 433

[56] References Cited

U.S. PATENT DOCUMENTS

| | | |
|---|---|---|
| 4,859,532 | 8/1989 | Oyama et al. . |
| 4,965,121 | 10/1990 | Young et al. . |
| 4,996,105 | 2/1991 | Oyama et al. ............. 428/336 |
| 5,229,881 | 7/1993 | Day et al. . |
| 5,834,103 | 11/1998 | Bond et al. ............. 428/216 |

FOREIGN PATENT DOCUMENTS

| | | |
|---|---|---|
| 0488048 | 6/1992 | European Pat. Off. . |
| 0638528 | 2/1995 | European Pat. Off. . |
| 0645352 | 3/1995 | European Pat. Off. . |
| 0709349 | 5/1996 | European Pat. Off. . |
| 2708926 | 2/1995 | France . |
| 2279365 | 1/1995 | United Kingdom . |
| 95/29883 | 11/1995 | WIPO . |

*Primary Examiner*—William Krynski
*Assistant Examiner*—Hong J. Xu
*Attorney, Agent, or Firm*—Venable; George H. Spencer; Ashley J. Wells

[57] ABSTRACT

A coated sheet for use in a laminated assembly and having a high level of luminous transmission and a low energy transmission includes a transparent substrate carrying a coating including two metal layers formed of silver or silver alloy and three layers of a transparent dielectric non-absorbent material, in the sequence, from the substrate: non-absorbent 1/metal 1/non-absorbent 2/metal 2/non-absorbent 3, wherein the two metal layers have a total geometrical thickness which ranges from 16.5 to 22 nm, wherein the non-absorbent 1 layer has an optical thickness which ranges from 50 to 56 nm, wherein the three layers of a transparent dielectric non-absorbent have a total optical thickness which ranges from 220 to 260 nm, and wherein the coated sheet has a thickness ratio of non-absorbent 2:non-absorbent 1 which ranges from 2.1:1 to 2.8:1.

27 Claims, No Drawings

COATED SUBSTRATE FOR TRANSPARENT ASSEMBLY WITH HIGH SELECTIVITY

CROSS-REFERENCE TO RELATED APPLICATION

This application claims the priority of United Kingdom Patent Application No. 9606281.5 filed Mar. 26, 1996 and titled "Coated substrate for transparent assembly with high selectivity" the subject matter of which is incorporated herein by reference.

BACKGROUND OF THE INVENTION

1. Field of the Invention

This invention relates to a coated substrate, in particular to a coated transparent sheet providing a laminated assembly with a high selectivity, i.e. a high ratio of luminous transmission to energy transmission.

2. Description of the Related Art

Laminated assemblies comprising coated substrate sheets which provide the assemblies with high selectivity have become much used for vehicle windows, especially for motor cars and railway carriages. These duties pose the conflicting needs of providing adequate light transmission, in many instances as defined by legal regulations, while protecting the vehicle occupants against solar radiation. Desirably the window also presents a pleasing tint to the vehicle occupants and passers-by.

Several of the terms used for the properties of a coated substrate have precise meanings defined by an appropriate standard. Those used herein include the following, most of them as defined by the International Commission on Illumination—Commission Internationale de l'Eclairage ("CIE").

In the present specification, two standard illuminants are used: Illuminant C and Illuminant A, as defined by CIE. Illuminant C represents average daylight having a colour temperature of 6700K. Illuminant A represents the radiation of a Planck radiator at a temperature of about 2856K. This illuminant represents the light emitted by car headlamps and is essentially used to evaluate the optical properties of glazing panels for motor vehicles.

The term "luminous transmission" (TLA) used herein is as defined by CIE, namely the luminous flux transmitted through a substrate as a percentage of the incident luminous flux of Illuminant A.

The term "energy transmission" (TE) used herein is as defined by CIE, namely the total energy directly transmitted through a substrate without change in wavelength. It excludes the absorbed energy (AE), i.e. the energy which is absorbed by the substrate.

The term "selectivity" (SE) used herein is the ratio of luminous transmission (TLA) to energy transmission (TE).

The term "colour purity" used herein refers to the excitation purity measured with illuminant C as defined in the CIE International Lighting Vocabulary, 1987, pages 87 and 89. The purity is specified according to a linear scale on which a defined white light source has a purity of zero and the pure colour has a purity of 100%. For vehicle windows the purity of the coated substrate is measured from the side which is to form the external surface of the window.

The dominant wavelength ($\gamma_D$) is the peak wavelength in the range transmitted or reflected by the coated substrate.

The terms "refractive index" and "spectral absorption index" are defined in the CIE International Lighting Vocabulary, 1987, pages 127, 138 and 139.

The substrate is most typically a vitreous material such as glass but can be another transparent rigid material such as polycarbonate or polymethyl methacrylate.

For various reasons, many of them related to considerations of sound or heat transmission or to safety in the event of breakage, the assembly normally comprises two or more laminated sheets. A typical laminated assembly comprises, in sequence, a first layer of glass, a layer of transparent adhesive such as polyvinylbutyral (PVB) and a second layer of glass. The thickness of each glass layer is typically in the range of 1.6 to 3 mm. The mean refractive index of the assembly, ignoring the effect of the coating layers, is typically 1.5. The coating is generally applied to the inner face (i.e. the face in contact with the adhesive) of the sheet that in use will form the external sheet of the assembly, but it can alternatively be applied to the inner face of the sheet that in use will form the internal sheet of the assembly.

A laminated assembly tends to have different optical properties from those of a single glass sheet. The differences arise mainly from the use of multiple sheets. Thus the properties required of, and achieved by, a laminated assembly differ from those of a single glass sheet. Care must therefore be taken in manufacturing a laminated assembly to make appropriate selection of the respective materials, thicknesses and coatings so as to ensure that the sought-after properties are achieved.

For road vehicle windows the legal requirement for luminous transmission (TLA) of windshields is at least 70% in USA and at least 75% in Europe. With regard to solar radiation, the total energy directly transmitted (TE) is desirably well below 50%. A further factor is the colour tint of the coated substrate, which should present a pleasing appearance. A pink tint may be found attractive and a green tint is even more so, which poses an additional problem in achieving the desired colour from the coating while retaining the required high luminous transmission and low energy transmission.

The requirements for railway carriage windows are similar to the above while not in every case so closely regulated by law. The need generally remains to keep the luminous transmission high and the energy transmission low.

For vehicle applications the purity of the reflected colour is preferably low. This has been found to be particularly difficult to achieve simultaneously with a high level of luminous transmission and a low level of energy transmission.

It has become increasingly popular to apply to glass sheets several coating layers, known as a stack, in order to modify their transmission and reflecting properties. Prior proposals have been made for metal and metal oxide layers in many different combinations to serve as the coating stack to impart selected properties to the glass. One recent combination of layers attracting attention has been the so-called "five layer" stack, typically comprising three layers of metal oxide applied alternately with two layers of metal.

U.S. Pat. No. 4,965,121 relates to such a stack for vehicle windshield glass and comprising in sequence from the substrate: a first layer, of dielectric material; a second layer, of partially reflective metallic material; a third layer of dielectric material; a fourth layer, of partially reflective metallic material; and a fifth layer, of dielectric material. The dielectric material is required to have a refractive index of 1.7 to 2.7. The first and fifth layers have substantially the same optical thickness but are 33–45% of the optical thickness of the third layer. The second and fourth layers have thicknesses within the range of 75–100% of each other. The claimed stack typically gives a high light transmission and a substantially neutral reflective visible light colour.

French Patent specification 2708926-A1 similarly relates to a five-layer stack, in this case to impart to vehicle or building glass a combination of high selectivity, i.e. a ratio of luminous transmission to energy transmission as high as possible, while retaining a pleasant visual aspect in reflection. It seeks to achieve this purpose by a stack comprising in sequence from the substrate: a first layer of dielectric material; a first metallic layer with infra-red reflecting properties; a second layer of dielectric material; a second metallic layer with infra-red reflecting properties; and a third layer of dielectric material. The first infra-red reflecting layer has a thickness of 55–57% of the second infra-red reflecting layer.

SUMMARY OF THE INVENTION

We have discovered that the required combination of optical properties sought by the invention may be realised, and other advantages may be obtained, by a five-layer multi-coated substrate in which the coating layers are formed from specific materials within specific thickness limits and with specific ratios in the respective thicknesses of certain layers.

According to the invention there is provided a coated sheet, for use in a laminated assembly having a high level of luminous transmission and a low energy transmission, comprising a transparent substrate carrying two metal layers formed of silver or silver alloy and three layers of a transparent dielectric non-absorbent material, in the sequence, from the substrate: non-absorbent 1/metal 1/non-absorbent 2/metal 2/non-absorbent 3, wherein the total geometrical thickness of the metal layers is in the range 16.5 to 22 nm, the optical thickness of the non-absorbent 1 layer is in the range 50 to 56 nm, the total optical thickness of the non-absorbent layers is in the range 220 to 260 nm and the thickness ratio non-absorbent 2:non-absorbent 1 is in the range 2.1:1 to 2.8:1.

The invention further provides a process for the production of a coated sheet, for use in a laminated assembly having a high level of luminous transmission and a low energy transmission, which comprises depositing on a transparent substrate two metal layers formed of silver or silver alloy and three layers of a transparent dielectric non-absorbent material, in the sequence, from the substrate: non-absorbent 1/metal 1/non-absorbent 2/metal 2/non-absorbent 3, wherein the total geometrical thickness of the metal layers is in the range 16.5 to 22 nm, the optical thickness of the non-absorbent 1 layer is in the range 50 to 56 nm, the total optical thickness of the non-absorbent layers is in the range 220 to 260 nm and the thickness ratio non-absorbent 2: non-absorbent 1 is in the range 2.1:1 to 2.8:1.

DESCRIPTION OF THE PREFERRED EMBODIMENTS

Clear substrates coated according to the invention provide laminated assemblies having the advantageous combination of luminous transmission of at least 75% and energy transmission of less than 42%. Indeed with certain types of clear glass substrate the energy transmission can be reduced to less than 40%, while retaining the better-than-75% luminous transmission. Such transmission properties make the assemblies highly advantageous as vehicle windshields.

A further desired quality for all glass assemblies used in vehicle windows is a low energy absorption, which should be much less than the energy transmission and energy reflection of the assembly.

The laminated assembly according to the invention also provides for a pleasantly tinted aspect in reflection ranging from pinkish at the lower end (2.10 to 2.40:1) of the defined thickness ratio of non-absorbent 2: non-absorbent 1, to bluish at the upper end (2.70 to 2.80:1). Near the centre of the range (2.45 to 2.65:1) the tinted aspect is greenish, provided that the thickness ratio non-absorbent 3: non-absorbent 1 is in the range 0.85 to 1.10:1. The proviso arises because the coloration is also affected by the thickness ratio non-absorbent 3: non-absorbent 1.

For a vehicle window of the type that includes a black peripheral border applied by serigraphy there is a tendency for a narrow pink band to appear in reflection adjacent to the border. This band, which arises from luminous interference between the coating and the serigraphic border, can be avoided by increasing the oxide layer thicknesses by about 10%.

For a given value of the ratio non-absorbent 2: non-absorbent 1 within the central greenish zone (2.45 to 2.65:1) and a given value of the ratio non-absorbent 3: non-absorbent 1 within the defined range (0.85 to 1.10:1), the dominant wavelength of the laminated assembly increases, i.e. the colour moves towards yellow, when the thickness of the metal 1 layer increases relative to that of the metal 2 layer.

The invention thus provides the further advantage of readily providing the green tint currently favoured for vehicle windows, at the same time as satisfying the demand for high luminous transmission and low energy transmission.

Although the use of clear substrate material is necessary to achieve the required European levels of 75% luminous transmission for vehicle windshield assemblies, the invention includes within its scope the use of at least one substrate sheet which is itself coloured. For example, for the slightly lower luminous transmission of 70% specified for windshields in USA, assemblies according to the invention including at least one coloured glass sheet can reduce the energy transmission to less than 37%. These assemblies are also well suited to use as road vehicle front side windows. For applications in road vehicle rear side and back windows, assemblies according to the invention including at least one coloured glass sheet provide the combination of luminous transmission of at least 30% and energy transmission of less than 25%.

Assemblies according to the invention further provide levels low luminous reflection, with a maximum reflection of 10% of the incident light. Such low levels of reflection are of especial benefit both for vehicle and architectural applications. High levels of reflected light are uncomfortable for an observer and in the case of road vehicle windows can present a hazard to drivers of other vehicles.

In some instances the coating is most conveniently applied during the glass-forming stage, for example to flat glass sheet in or after a float glass chamber. For vehicle window panels, which generally need to be bent to the shape dictated by the shape of the vehicle bodywork, the coating can either be applied before or after the substrate has been formed and bent into the required shape and size. For vehicle window panels which are coated while still flat and then bent into shape, care must be taken to ensure that the bending action does not harm the coating. The said care may include slightly changing the coating composition or structure to render the coating more capable of withstanding the bending action.

The low thickness of the respective layers of the invention provides operational advantages both in terms of the short time taken to apply the layers and in the economical use of the respective materials.

The total geometrical thickness of the metal layers is preferably in the range 16.5 to 20 nm.

The coating is preferably applied to a face of the substrate sheet that will form an internal surface of the laminated assembly.

The metal layers comprise silver or a silver alloy, such as alloys of silver with platinum or palladium.

The term "non-absorbent material" used herein refers to a material which has a refractive index [n(γ)] greater than the value of the spectral absorption index [k(γ)] over the whole of the visible spectrum (380 to 780 nm). It is advantageous for the non-absorbent material of the invention to have a refractive index greater than 10 times the spectral absorption index.

Preferably the non-absorbent material has a refractive index measured at 550 nm of between 1.85 and 2.2, advantageously between 1.9 and 2.1.

Suitable non-absorbent materials include oxides such as tin oxide ($SnO_2$) and zinc oxide (ZnO), nitrides such as silicon nitride ($Si_3N_4$) or a mixture thereof or a complex of non-absorbent materials such as zinc stannate ($Zn_2SnO_4$). Zinc oxide is a particularly preferred material due to its high deposit rate, its refractive index—which is well suited to the requirements of the invention—and its beneficial effect on the passivation of the silver layer.

Each complete non-absorbent layer can include more than one of these materials and each layer can be a composite layer formed of successive subsidiary layers of different composition from each other, for example a zinc oxide layer split into two or more sub-layers by one or more layers of another non-absorbent material, such as tin oxide. The sub-layers may be deposited simultaneously and/or successively. It is not essential for the metal and the oxygen or nitrogen in the layer to be present in stoichiometric proportions.

A combination of tin oxide and zinc oxide is generally advantageous, whether in admixture or in successive sub-layers. This seems to be a result of their having very similar refractive indices.

The coated substrate according to the invention may further comprise, as part of a non-absorbent layer, a thin layer of sacrificial material provided above (i.e. subsequently deposited) and in contact with each metal layer. The purpose of the sacrificial material is to protect the silver or silver alloy during deposition of the next non-absorbent layer. Suitable sacrificial materials include titanium and zinc. Titanium is generally preferred because of its being readily oxidisable.

The total optical thickness of the sacrificial material i.e. the total of the sacrificial material layers in the respective non-absorbent layers, should be not more than 15 nm. When the coating process has been completed substantially the whole of the sacrificial material is present in oxide form.

The coating layers are preferably applied by cathode sputtering. This may be effected by introducing the substrate into a processing chamber containing an appropriate magnetron sputtering source, and provided with entry and outlet gas-locks, a conveyor for the substrate, power sources, sputtering gas inlets and an evacuation outlet. The substrate is transported past the activated sputtering source and cold sputtered by an appropriate atmosphere (oxygen gas in the case of an oxide coating) to give the desired layer on the substrate. The procedure is repeated for each coating layer.

When using this method the use of a sacrificial material is highly desirable in order to protect the metal layer against oxidation during the subsequent deposition of a non-absorbent oxide layer. If however the non-absorbent material is a nitride rather than an oxide, the layer is deposited in an atmosphere of nitrogen and a layer of sacrificial material is not required.

Because silicon nitride is deposited using a cathode of silicon which has been doped, for example with aluminium, nickel, boron, phosphorus and/or tin, the dopant element(s) may be present in the non-absorbent material layer.

The coating layers may be completed by a thin (2–5 nm) protective layer which shields the coating without significantly modifying the optical properties of the product. Otherwise the third non-absorbent layer will usually be an exposed layer. Suitable materials for the thin exposed protective additional layer are oxides, nitrides and oxynitrides of silicon. Silica ($SiO_2$) is the generally preferred material. This layer provides the coated substrate with improved chemical and/or mechanical durability, with little or no consequential change in its optical properties.

Glazing panels comprising the laminated assemblies of the invention may be installed in single or multi-glazed units, for example as double-glazing units or windshields for vehicles.

One version of multiple glazing unit for a vehicle comprises a laminated assembly according to the invention positioned in face-to-face spaced apart relationship with a sheet of transparent vitreous material and having a gas space, delimited by a peripherally extending spacer, between the said assembly and sheet. In this unit the coated surface is directed towards the gas space.

A laminated glazing unit may comprise at least two sheets of transparent vitreous material secured to each other with the aid of an intervening film of polymer adhesive material, wherein at least one of the sheets is a coated substrate according to the present invention, with the coated surface directed towards the polymer adhesive. Where the coated substrate is used in such a structure the use of a thin protective layer, as discussed above, is desirable to shield the coating and guard against delamination of the coating.

The invention will now be described in more detail, with reference to the following non-limiting examples.

The properties of the coated substrate quoted in the Examples herein were measured on the basis of a laminated assembly comprising, in sequence, a sheet of ordinary soda-lime glass having a thickness of 2.1 mm, a coating on the said sheet, a layer of polyvinylbutyral (pvb) adhesive having a thickness of 0.76 mm and a second sheet of ordinary soda-lime glass having a thickness of 2.1 mm.

EXAMPLES 1–10

Samples of a substrate sheet of 2.1 mm glass were passed though an on-line deposition apparatus comprising two vacuum deposition chambers (at a pressure of 0.3 Pa), a conveyor for the substrate, power sources and gas entry locks. Each deposition chamber contained magnetron sputtering cathodes, sputtering gas inlets and an evacuation outlet, deposition being achieved by passing the substrate sample several times under the cathodes.

The first chamber included cathodes provided with targets formed of zinc and tin, and was employed for the deposition in an oxygen atmosphere of non-absorbent layers of zinc oxide and tin oxide. The second chamber included a silver cathode and a titanium cathode and was employed for the deposition of these metals in an inert (argon) atmosphere, the titanium being required for the deposition of a sacrificial layer. Each substrate sample was subjected to several return passages in order to obtain the desired succession and thickness of coating layers.

The glass used as the substrates was soda-lime glass having a thickness of 2.1 mm and the further properties shown below:

| Type of glass | TLA (%) | TE (%) | $\lambda_D$ (nm) | Purity (%) |
| --- | --- | --- | --- | --- |
| Clear (I) | 90.6 | 87.8 | 571 | 0.5 |
| Coloured (II) | 84.4 | 67.6 | 508 | 1.3 |
| Coloured (III) | 80.2 | 59.5 | 509 | 1.8 |
| Coloured (IV) | 57.0 | 44.6 | 503 | 3.4 |

In each case there was applied to the substrate:

a first non-absorbent layer (Ox-1) of zinc oxide and tin oxide, a first silver layer metal (Ag-1), a second non-absorbent layer (Ox-2) of zinc oxide, tin oxide and titanium oxide, the latter having an optical thickness of 7.5 nm and being in contact with the first silver metal layer (Ag-1), a second silver layer (Ag-2), a third non-absorbent layer (Ox-3) of zinc oxide, tin oxide and titanium oxide, the latter having an optical thickness of 7.5 nm and being in contact with the second silver metal layer (Ag-2).

The so-coated sheets were formed into laminated panels comprising the aforementioned laminated assembly of the coated sheet, a layer of polyvinylbutyral adhesive and a second sheet of 2.1 mm glass. In Examples 1 to 7 both sheets were of clear glass (type I). In Examples 8 to 10 at least one of the sheets was coloured glass (types II, III or IV).

Further details of each of the non-absorbent (Ox-1, Ox-2 and Ox-3) and silver layers (Ag-1 and Ag-2) of the coated sheet and the resultant properties of the coating stack thereby formed are shown in the accompanying Tables.

Table A shows the constituent materials of the non-absorbent layers of the coating stack and their geometrical thicknesses. The Examples 1 to 4 and 8 to 10 present an Ox-1 layer comprising equal thicknesses of $SnO_2$ and ZnO. The Examples 5 to 7 present an Ox-1 layer always comprising 10 nm of $SnO_2$ and the rest of the thickness of the said layer being ZnO. The Ox-2 layer of each example is made of the succession $TiO_2$/ZnO/$SnO_2$/ZnO/$SnO_2$/ZnO, the thickness of the extreme sub-layers of ZnO being the same, as well as those of the two sub-layers of $SnO_2$, these thicknesses being themselves about half of that of the central sub-layer of ZnO. The Ox-3 layer of each example comprises 2.5 nm of $TiO_2$ and 10 to 13 nm of $SnO_2$, the rest of the thickness of the said layer being ZnO.

Table B shows for Examples 1 to 7 the optical thicknesses of each of the layers, the total optical thickness of the non-absorbent layers (Ox-1+Ox-2+Ox-3), the ratio of optical thicknesses of the first and second non-absorbent layers (Ox-2:Ox-1), the ratio of optical thicknesses of the first and third non-absorbent layers (Ox-3:Ox-1), and, for the resultant laminated panel, the luminous transmission of Illuminant A (TLA), the energy transmission (TE), the dominant wavelength $\gamma_D$, the purity and, where appropriate, the resultant tint. Table C shows similar data to Table B but for Examples 8 to 10 and additionally shows the types of glass employed.

The panels of Examples 1 to 7 are well suited to use as vehicle windshields. The Example 8 panel is well suited to use a vehicle front side window and those of Examples 9 and 10 are well suited to use as vehicle rear windows or rear side windows.

TABLE A

| Example | Ox-1 $SnO_2$/ZnO (nm) | Ox-2 $TiO_2$/ZnO/$SnO_2$/ZnO/$SnO_2$/ZnO (nm) | Ox-3 $TiO_2$/ZnO/$SnO_2$ (nm) |
| --- | --- | --- | --- |
| 1. | 13.1/13.1 | 2.5/10/10/23/10/10 | 2.5/13/13 |
| 2. | 14.0/14.0 | 2.5/11/11/22.5/11/11 | 2.5/11.25/11.25 |
| 3. | 13.4/13.4 | 2.5/11/11/22.5/11/11 | 2.5/10/10 |
| 4. | 13.0/13.0 | 2.5/10/10/22/10/10 | 2.5/11/11 |
| 5. | 10.0/17.0 | 2.5/11/11/22/11/11 | 2.5/22/10 |
| 6. | 10.0/15.0 | 2.5/10/11/20.5/11/10 | 2.5/20/10 |
| 7. | 10.0/15.6 | 2.5/11/11/21/11/11 | 2.5/11/10 |
| 8. | 14.5/14.5 | 2.5/11/12/24/12/11 | 2.5/15/10 |
| 9. | 14.5/14.5 | 2.5/11/12/24/12/11 | 2.5/15/10 |
| 10. | 14.5/14.5 | 2.5/11/12/24/12/11 | 2.5/15/10 |

TABLE B

| Example | Ox-1 ZnO/$SnO_2$ (nm) | Ag-1 (nm) | Ox-2 ZnO/$SnO_2$ (nm) | Ag-2 (nm) | Ox-3 ZnO/$SnO_2$ (nm) | Ox Total (nm) |
| --- | --- | --- | --- | --- | --- | --- |
| 1. | 52.4 | 8.9 | 132.0 | 8.9 | 58.7 | 243.1 |
| 2. | 56.0 | 9.0 | 140.7 | 9.0 | 51.3 | 248.0 |
| 3. | 53.4 | 8.8 | 134.7 | 8.0 | 46.3 | 234.3 |
| 4. | 51.6 | 9.6 | 130.1 | 8.0 | 50.3 | 232.0 |
| 5. | 54.0 | 8.8 | 138.3 | 8.8 | 70.3 | 262.6 |
| 6. | 50.0 | 8.8 | 131.3 | 8.8 | 66.3 | 247.6 |
| 7. | 51.2 | 8.8 | 136.1 | 8.8 | 48.5 | 235.8 |

| Example | Ratio Ox-2: Ox-1 | Ratio Ox-3: Ox-1 | TLA (%) | TE (%) | $\lambda_D$ (nm) | Purity (%) | Colour |
| --- | --- | --- | --- | --- | --- | --- | --- |
| 1. | 2.52 | 1.12 | 76.1 | 41.3 | −493 | 2 | reddish purple |
| 2. | 2.51 | 0.96 | 76.2 | 41.0 | 487 | 7 | greenish blue |
| 3. | 2.52 | 0.88 | 75.5 | 40.7 | 495 | 2 | bluish green |
| 4. | 2.52 | 0.99 | 75.0 | 40.6 | 581 | 5 | greenish yellow |
| 5. | 2.56 | 1.30 | 76.1 | 41.1 | −554 | 4 | bluish purple |
| 6. | 2.63 | 1.33 | 75.5 | 40.5 | −542 | 4 | bluish purple |
| 7. | 2.66 | 0.95 | 75.1 | 39.9 | 486 | 9 | greenish blue |

TABLE C

| Example | External glass | Adhesive | Ox-1 (nm) | Ag-1 (nm) | Ox-2 (nm) | Ag-2 (nm) | Ox-3 (nm) | Ox Total (nm) | Ratio Ox-2: Ox-1 | Internal glass | TLA (%) | TE (%) | Colour |
| --- | --- | --- | --- | --- | --- | --- | --- | --- | --- | --- | --- | --- | --- |
| 8. | (I) | pvb | 58.4 | 9.5 | 146.4 | 9.5 | 55.9 | 260.7 | 2.51 | (II) | 70.9 | 35.6 | green |
| 9. | (III) | pvb | 58.4 | 9.5 | 146.4 | 9.5 | 55.9 | 260.7 | 2.51 | (III) | 55.0 | 23.3 | green |
| 10. | (IV) | pvb | 58.4 | 9.5 | 146.4 | 9.5 | 55.9 | 260.7 | 2.51 | (IV) | 30.3 | 14.1 | green |

What is claimed is:

1. A coated sheet for use in a laminated assembly and having a high level of luminous transmission and a low energy transmission, comprising:
a transparent substrate carrying a coating comprised of two metal layers formed of silver or silver alloy and three layers of a transparent dielectric non-absorbent material, in the sequence, from the substrate: non-absorbent 1/metal 1/non-absorbent 2/metal 2/non-absorbent 3,
wherein, as part of at least one of the three layers of transparent dielectric non-absorbent material, a thin layer of sacrificial material having a total optical thickness which does not exceed 15 nm is provided above and in contact with each of the two metal layers,
wherein the two metal layers have a total geometrical thickness which ranges from 16.5 to 22 nm,
wherein the non-absorbent 1 layer has an optical thickness which ranges from 50 to 56 nm,
wherein the three layers of a transparent dielectric non-absorbent have a total optical thickness which ranges from 220 to 260 nm, and
wherein the coated sheet has a thickness ratio non-absorbent 2:nonabsorbent 1 which ranges from 2.1:1 to 2.8:1.

2. The coated sheet accordance to claim 1, wherein thickness ratio of non-absorbent 2:non-absorbent 1 ranges from 2.10 to 2.40:1.

3. The coated sheet according to claim 1, wherein the thickness ratio of non-absorbent 2:non-absorbent 1 ranges from 2.45 to 2.65:1 and the thickness ratio of non-absorbent 3:non-absorbent 1 ranges from 0.85 to 1.10:1.

4. The coated sheet according to claim 1, wherein the thickness ratio of non-absorbent 2:non-absorbent 1 ranges from 2.70:1 to 2.80:1.

5. The coated sheet according to claim 1, wherein the total geometrical thickness of the two metal layers ranges from 16.5 to 20 nm.

6. The coated sheet according to claim 1, wherein the substrate is a sheet and is itself colored.

7. The coated sheet according to claim 1, wherein the substrate is a sheet and is clear.

8. The coated sheet according to claim 1, wherein the two metal layers comprise one of silver or an alloy of silver with one of platinum or palladium.

9. The coated sheet according to claim 1, wherein the transparent dielectric non-absorbent material has a refractive index and a spectral absorption index, and wherein the refractive index is greater than 10 times the spectral absorption index.

10. The coated sheet according to claim 1, wherein the transparent dielectric non-absorbent material has a refractive index measured at 550 nm ranging between 1.85 and 2.2.

11. The coated sheet according to claim 1, wherein the transparent dielectric non-absorbent material comprises at least one of tin oxide ($SnO_2$), zinc oxide (ZnO), silicon nitride ($Si_3N_4$) and zinc stearate ($Zn_2SnO_4$).

12. The coated sheet according to claim 1, wherein each of the three layers of a transparent dielectric non-absorbent material includes more than one non-absorbent material.

13. The coated sheet according to claim 12, wherein each layer of the three layers of a transparent dielectric non-absorbent material comprises tin oxide and zinc oxide.

14. The coated sheet according to claim 12, wherein each layer of the three layers of a transparent dielectric non-absorbent material is a composite layer formed of successive subsidiary layers having a different composition from each other.

15. A coated sheet for use in a laminated assembly and having a high level of luminous transmission and a low energy transmission, comprising:
a transparent substrate carrying a coating comprised of two metal layers formed of silver or silver alloy and three layers of a transparent dielectric non-absorbent material, in the sequence, from the substrate: non-absorbent 1/metal 1/non-absorbent 2/metal 2/nonabsorbent 3,
wherein, as part of at least one of the three layers of transparent dielectric non-absorbent material, a thin layer of sacrificial material is provided above and in contact with each of the two metal layers and is selected from the group consisting of titanium and zinc,
wherein the two metal layers have a total geometrical thickness which ranges from 16.5 to 22 nm,
wherein the non-absorbent 1 layer has an optical thickness which ranges from 50 to 56 nm,
wherein the three layers of a transparent dielectric non-absorbent have a total optical thickness which ranges from 220 to 260 nm, and
wherein the coated sheet has a thickness ratio non-absorbent 2:nonabsorbent 1 which ranges from 2.1:1 to 2.8:1.

16. The coated sheet according to claim 1, further comprising an outer protective layer having a thickness ranging from 2 to 5 nm and being comprised of at least one of oxides, nitrides and oxynitrides of silicon.

17. A laminated assembly, comprising a coated sheet according to claim 1, wherein the coating is applied to a face of the substrate that forms an internal surface of the laminated assembly.

18. The laminated assembly according to claim 17, having a luminous transmission of at least 75% and an energy transmission of less than 42%.

19. The laminated assembly according to claim 18, having an energy transmission of less than 40%.

20. The laminated assembly according to claim 17, having a luminous transmission of a least 70% and an energy transmission of less than 37%.

21. The laminated assembly according to claim 17, having a luminous transmission of a least 30% and an energy transmission of less than 25%.

22. A vehicle windshield comprising the laminated assembly according to claim 18.

23. A vehicle windshield comprising the laminated assembly according to claim 20.

24. A double-glazing panel comprising the laminated assembly as claimed in claim 17.

25. A double-glazing panel comprising a sheet of transparent vitreous material and the laminated assembly according to claim 24 positioned in face-to-face spaced apart relationship with the sheet of transparent vitreous material, and having a peripherally extending spacer positioned between the laminated assembly and the sheet so that a gas space is defined therebetween.

26. A coated sheet for use in a laminated assembly and having a high level of luminous transmission and a low energy transmission, comprising:
a transparent substrate carrying a coating comprised of two metal layers formed of silver or silver alloy and three layers of a transparent dielectric non-absorbent material, in the sequence, from the substrate: non-absorbent 1/metal 1/non-absorbent 2/metal 2/non-absorbent 3, wherein the two metal layers have a total geometrical thickness which ranges from 16.5 to 22 nm, wherein the non-absorbent 1 layer has an optical thickness which ranges from 50 to 56 nm, wherein the three layers of a transparent dielectric non-absorbent have a total optical thickness which ranges from 220 to 260 nm, wherein the coated sheet has a thickness ratio non-absorbent 2:nonabsorbent 1 which ranges from 2.1:1 to 2.8:1, and wherein the coated sheet, when included in said laminated assembly, provides said laminated assembly with an energy transmission of less than 42% and a luminous transmission of a least 70%.

27. The coated sheet according to claim 26, wherein, as part of at least one of the three layers of transparent dielectric non-absorbent material, a thin layer of sacrificial material is provided above and in contact with each of the two metal layers.

\* \* \* \* \*